United States Patent [19]
Lowe

[11] Patent Number: 5,777,529
[45] Date of Patent: Jul. 7, 1998

US005777529A

[54] INTEGRATED CIRCUIT ASSEMBLY FOR DISTRIBUTED BROADCASTING OF HIGH SPEED CHIP INPUT SIGNALS

[75] Inventor: Kerry S. Lowe, Nepean, Canada

[73] Assignee: Northern Telecom Limited, Montreal, Canada

[21] Appl. No.: 728,428

[22] Filed: Oct. 10, 1996

[51] Int. Cl.$^6$ .................................................. H01P 5/00
[52] U.S. Cl. ........................... 333/33; 287/664; 333/247; 340/825.86
[58] Field of Search ................... 333/104, 33, 247; 327/331, 403, 415; 257/664, 671, 728, 923; 340/825.86, 825.87, 825.85

[56] References Cited

U.S. PATENT DOCUMENTS

| | | | |
|---|---|---|---|
| 4,595,881 | 6/1986 | Kanaan | 330/54 |
| 4,845,440 | 7/1989 | Aitchison | 330/277 |
| 4,908,529 | 5/1990 | Aitchison . | |
| 4,991,001 | 2/1991 | Takubo et al. | 333/247 X |
| 5,021,759 | 6/1991 | Gamand et al. | 333/247 X |
| 5,334,962 | 8/1994 | Higgins et al. | 333/247 |
| 5,365,197 | 11/1994 | Ikalainen | 330/286 |
| 5,373,187 | 12/1994 | Sugino et al. | 333/247 X |
| 5,376,909 | 12/1994 | Nelson et al. | 333/33 X |
| 5,475,679 | 12/1994 | Munter | 370/395 |
| 5,499,239 | 3/1996 | Munter | 370/423 |
| 5,519,350 | 5/1996 | Diodato et al. | 327/295 |

OTHER PUBLICATIONS

Shin et al., in "An experimental experimental 5 Gb/s 16×16 Si–bolar crosspoint switch", IEEE J. Solid State Circuits, vol. 27, No. 12, Dec. 1992.

Savara et al., in "A 2.5 Gb/s 16×16 crosspoint switch with fast programming", 1995 IEEE BaAs IC Symposium Abstracts, pp. 47–48.

T.Y. Wong, et al., in an article entitled "A Gb/s AlGaAs HBT high power fully differential limiting distributed amplifier for III–V Mach–Zehnder modulator" in GaAs IC Symp. Dig. Tech. Papers, pp. 201–204, 1995.

T.Y. Wong in "Fundamentals of distributed Amplification", Chapter 1, pp. 1–13 (Artech House 1993).

T. Lester et al., in "A manufacturable process for HBT circuits" in Proc. IOP Int. Symp. on GaAs and Related compounds, pp. 449–454, 1993.

Stitch et al., in an article entitled "The use of III–V Ics in WDM Optical network Equipment" GaAs IC Symp. Digest Tech. Papers, pp. 177–180, 1995.

*Primary Examiner*—Paul Gensler
*Attorney, Agent, or Firm*—Angela C. de Wilton

[57] ABSTRACT

An integrated circuit assembly and a method for distributed broadcasting of high speed chip input signals to a series of on-chip destination cells is provided, which eliminates the need for input buffers. A bufferless distributed broadcasting path is provided by matching the impedances off-chip conductive trace, i.e. a package trace, which together with interface circuitry forms a first transmission line, and on-chip conductive traces which form a second transmission line, to provide a constant impedance transmission line extending from a package trace to the far end of the on-chip trace. The method of bufferless distributed circuit (BDC) broadcasting is applicable to chip designs such as a crosspoint switch, parallel multiplier and distributed amplifier, and provides advantages of lower signal delay and power dissipation. In an experimental GaAs HBT 8×4 crosspoint switch, BDC broadcasting was found to achieve a significant power savings with negligible penalty in jitter or bit error rate performance at a 10 Gb/s data rate.

22 Claims, 11 Drawing Sheets

INTEGRATED CIRCUIT ASSEMBLY FOR DISTRIBUTED BROADCASTING OF HIGH SPEED CHIP INPUT SIGNALS

FIELD OF THE INVENTION

This invention relates to an integrated circuit assembly and a method for distributed broadcasting of high speed chip input signals to destination cells within an integrated circuit.

BACKGROUND OF THE INVENTION

In designing an integrated circuit (IC), one or more chip input signals may need to be broadcast to a series of destination cells of the integrated circuit. For example, in designing a N×N crosspoint switch IC, having N input ports and N output ports, N input data signals are broadcast so that each of a plurality of selector cells (i.e. multiplexer cells) can choose one of the input signals and produce a chip output signal. Any output port may be connected to any input port, and broadcasting from one input port to several or all output ports is possible. Examples of crosspoint switches are described for example by Shin et al., in "An experimental 5 Gb/s 16×16 Si-bipolar crosspoint switch", IEEE J. Solid State Circuits, vol. 27, no. 12, December 1992, and by Savara et al., in "A 2.5 Gb/s 16×16 bit crosspoint switch with fast programming", 1995 IEEE GaAs IC Symposium Abstracts, pp. 47–48.

As another example, in a $2^N$:1 multiplexer IC or a 1:$2^N$ demultiplexer IC, a clock input signal must be broadcast to N-1 flip flop cells to form a clock generator. The signal arriving at each destination cell must meet specifications for, e.g., voltage amplitude, voltage offset, rise time, propagation delay, jitter, and crosstalk.

For a low speed signal, typically defined as one for which the rise time is more than five times the time of flight delay along a broadcast path, the design problem is simple to model. The broadcast path can be treated as a single node and modelled as a simple low pass RC network where R is the total interconnect resistance and C is the total interconnect capacitance plus total cell input capacitance.

For a high speed signal, typically defined as one for which the rise time is less than 2.5 times the time of flight delay along the broadcast path, the design problem is more complex to model. The broadcast path must be treated as a transmission line and modelled with inductance so that effects such as waveform ringing can be predicted and controlled (see for example, Bakoglu et al., in Circuits, Interconnections and Packaging for VLSI, section 6.5, pp. 239–244 (Addison Wesley, 1990)). In practice, either a long physical path length or a short rise time, or both, can necessitate a signal being treated as "high speed". For example, assuming a 0.15 mm/ps propagation speed, a 1 Gb/s signal with a 250 ps rise time must be treated as high speed when the physical distance from input to the farthest destination cell is about 15 mm. A 10 Gb/s signal with a 25 ps rise time must be treated as high speed when the physical distance is only about 1.5 mm. Given the wide range of ICs that require input broadcasting and given the continuing trend towards larger chip sizes and faster rise times, particularly for large scale GaAs HBT high speed circuits, it is evident that there is an increasing need to identify effective techniques for broadcasting high speed chip input signals.

One known method for broadcasting high speed chip input signals will be termed conventional distributed circuit (CDC) broadcasting. CDC broadcasting is a technique commonly used in distributed amplifier ICs for example as described by T. Y. Wong, et al., in an article entitled "A 10 Gb/s AlGaAs/GaAs HBT high power fully differential limiting distributed amplifier for III–V Mach-Zehnder modulator" in GaAs IC Symp. Dig. Tech. Papers, pp. 201–204, 1995.

The development of distributed amplification is discussed by T. Y. Wong in, "Fundamentals of distributed amplification", Chapter 1, pp. 1–13 (Artech House 1993), and recent examples of distributed circuits are described, for example, in U.S. Pat. No. 5,519,350 to Diodato, entitled "Circuitry for delivering a signal to different load elements in an electrical system"; U.S. Pat. No. 5,365,197 to Ikalainen entitled "Low noise distributed amplifier"; U.S. Pat. No. 4,908,529 to Aitchison entitled "Logarithmic amplifier comprising MESFET distributed amplifiers connected in cascade"; U.S. Pat. No. 4,845,440 to Aitchison entitled "Distributed amplifier circuits"; and U.S. Pat. No. 4,595,881 to Kennan, entitled "Distributed amplifier using dual gate GaAs FETs".

In an integrated circuit using CDC broadcasting of high speed input signals from an off-chip source to a series of on-chip destination cells of the integrated circuit, the input signal is fed from an external source to the packaged integrated circuit through a datapath which includes a package trace extending from an input terminal of the packaged IC, i.e. through a conductive interconnect which is effectively a transmission line with a constant impedance $Z_P$ across its length, through the chip interface circuitry, which connects the package trace to the integrated circuit chip and terminates the package trace in its characteristic impedance by having $R_I=|Z_P|$. The interface circuitry may comprise, for example a conventional wirebond to an input pad of the integrated circuit, or other known form of interconnection, characterised by an inductance $L_I$, a resistance $R_Z$, and a pad parasitic capacitance $C_I$. The interface circuitry is coupled to an input buffer to provide voltage amplitude regeneration and, optionally, voltage amplitude translation, voltage offset translation or single ended to double ended translation. Important buffer design parameters which must be accounted for include input capacitance, output impedance and maximum toggle rate. The output of the input buffer is coupled to a plurality of destination cells through an on-chip conductive trace.

Thus the package trace and interface circuitry comprise an off-chip transmission line. The on-chip trace and the far end circuitry together comprise an on-chip transmission line. The on-chip trace is designed to approximate a transmission line that has constant impedance $Z_O$ across its length and the far end circuitry comprises of a resistor $R_E$, which terminates the on-chip trace, the value of $R_E$ being selected so that $R_E=|Z_O|$.

The design is determined by modelling the datapath as a series of lumped element sections where the section capacitance $C_O$ is the sum of wire capacitance $C_W$ and destination cell input capacitance $C_C$ and the section inductance $L_O$ is the sum of wire inductance and any intentionally added discrete element inductances. The section impedance, given by $\sqrt{L_O/C_O}$ is made equal to $Z_O$ for each section. Thus adjacent sections may have different $L_o$ and $C_c$, but the same $Z_O$.

The minimum rise time that can be supported in a CDC broadcast datapath depends on the cut-off frequencies of the on-chip and off-chip transmission lines. The cut-off frequency of the on-chip line $f_o$ is approximated $f_O \approx 1/(\pi \sqrt{L_O C_O})$. Conversely the cut-off frequency of the off-chip line $f_P$ is typically dominated by the interface circuitry. In this case $f_P$ is approximated by $f_P \approx 1(\pi \sqrt{L_I(C_I+C_B)})$ where $C_B$ is the buffer input capacitance.

Circuit simulation results provided evidence of the high speed capability of a CDC datapath of this structure. Nevertheless, the CDC datapath incurs overhead because the on-chip input buffer consumes a significant area and power, and may be a source of jitter. Also, the buffer increases signal propagation delay.

Consequently, it is not expected that CDC broadcasting would be feasible in the design of an integrated circuit such as a crosspoint switch IC for 10 Gb/s data, requiring a high speed and high dissipation technology. Each of the multiple high speed inputs would incur a high power overhead. Indeed, calculations suggest that the overhead of an example described in detail below may be 5 ps of output jitter, and 60 ps of propagation delay, and 0.15 W of power dissipation using a high speed and high dissipation technology such as GaAs HBT. An example of the latter technology is described by T. Lester et al. in "A manufacturable process for HBT circuits" in Proc. IOP Int. Symp. on GaAs and Related compounds, pp. 449–454, 1993. Thus, CDC has limitations for some high speed integrated circuit applications.

SUMMARY OF THE INVENTION

The present invention seeks to provide an integrated circuit assembly and a method of broadcasting high speed chip input signals which overcomes or avoids the above mentioned problems.

Thus according to one aspect of the present invention there is provided an integrated circuit assembly comprising a distributed broadcast data path from an input port of the integrated circuit to a plurality of destination cells of the integrated circuit for generating an output signal at an output port, comprising:

input means for coupling a high speed input signal to the input port of the integrated circuit, and forming a first transmission line having a characteristic impedance $Z_P$, a conductive trace of the integrated circuit extending form the input port to the plurality of destination cells, the conductive trace being terminated by a load resistor element and forming a second transmission line having a characteristic impedance $Z_O$, the characteristic impedances $Z_P$ and $Z_O$ of the first and second transmission lines being matched to provide for bufferless coupling of the input signal directly to the conductive trace of the integrated circuit.

Thus an integrated circuit assembly with bufferless inputs is provided, which allows for high speed distributed broadcasting at low power.

The input means may comprise for example an input trace of an integrated circuit package extending from input terminals of the package and coupled to interface circuitry of the integrated circuit, for example via a conventional wirebond or other form of interconnection. The impedances of the first (package) transmission line and second (on-chip) transmission line are matched. Thus a continuous transmission line of constant impedance is provided, running from the start of the package trace to a far end load resistor of the on-chip trace. The resulting broadcast path is characterized by the matched impedances of the on-chip trace and the package trace, i.e. $Z_O=Z_P$. Thus, an on-chip input buffer is not used, eliminating the buffer overhead with little or no penalty in signal quality. A conventional package chip interface resistor $R_I$ is not used, and only a far end resistor $R_E$ is needed for signal termination.

Preferably, destination cells are provided that have a double ended input and wide common mode input range to ensure destination cells are compatible with the chip input signal. The destination cells may for example be fully differential CML (current mode logic) design.

Advantageously, the transmission lines are coplanar waveguide structures, and the on-chip second transmission lines incorporate the input capacitance of the destination cells. The physical layout is beneficially arranged to provide for a regular side-by-side array of destination cells, with transmission lines arranged in parallel lines running across the destination cells.

The assembly is advantageously used for a high speed integrated circuit comprising a plurality of input ports wherein an input signal is broadcast from an input port to one of a plurality of destination cells of the integrated circuit to generate a signal at one of a plurality of output ports (i.e. a broadcast and select type architecture).

Another aspect of the present invention provides an assembly of an integrated circuit and a package, the package having a set of input terminals and a set of output terminals, and the integrated circuit having a lo corresponding set of input ports and a corresponding set of output ports, the integrated circuit providing a plurality of distributed broadcast datapaths from the input ports to a plurality of selector cells of the integrated circuit for generating output signals at selected output ports of the integrated circuit, a conductive trace of the package extending from each input terminal of package to the corresponding input port of the integrated circuit, each package trace forming a first transmission line having a characteristic impedance $Z_P$, and a conductive trace of the integrated circuit extending form each input port to each of the plurality of selector cells, each conductive trace being terminated by a load resistor element $R_E$, and forming a second transmission line having a characteristic impedance $Z_O$, the characteristic impedances $Z_P$ and $Z_O$ of the corresponding first transmission lines and second transmission lines being matched to provide a constant impedance transmission line for bufferless coupling of input signals from input terminals of the package directly to corresponding conductive traces of the integrated circuit.

In multi-port integrated circuits, such as crosspoint switches, bufferless data inputs allow for significant power savings.

For example, in a crosspoint switch for high speed operation at 10 Gb/s where a plurality of input signals is broadcast to a plurality of destination cells which comprise multiplexer cells, bufferless coupling of the input signals directly to multiplexer cells is beneficial in eliminating a significant area relative to conventional buffered inputs, reduces power dissipation, and has little effect on signal quality. In an advantageous physical layout, the plurality of destination cells are provided in a regular side-by-side array, and the set of on-chip transmission lines run across the destination cells as parallel lines extending from one side to another. The compact arrangement of the multiplexer cells also simplifies layout of the control ports and circuitry for controlling the multiplexer cells for selecting output ports.

According to another aspect of the present invention there is provided an integrated circuit comprising a plurality of input ports and a plurality of output ports, each input port for receiving an input signal for distributed broadcasting circuit to a plurality of destination cells of the integrated circuit for generating an output signal at a selected output port of the integrated circuit, comprising:

a set of conductive traces of the integrated circuit each extending from an input port to the plurality of destination cells, each trace being terminated by a far end load resistor $R_E$, and forming a transmission line having a characteristic impedance $Z_O$.

the characteristic impedance $Z_O$ of each transmission line being selected to match a characteristic impedance $Z_P$ of input means coupled to the corresponding input port, thereby providing for bufferless coupling of the input signal from the input means directly to the conductive trace of the integrated circuit.

Thus an integrated circuit for bufferless distributed broadcasting is provided, which may be coupled with suitable input means, for example a conventional wire-bonded package having conductive traces with matched impedance, or other suitable interconnection means for supplying a high speed input signal from matched impedance transmission lines.

According to a further aspect of the present invention there is provided a method of distributed broadcasting of a high speed input signal on an integrated circuit having a distributed broadcast data path comprising a conductive trace extending from a bufferless input port to a plurality of destination cells of the integrated circuit for generating an output signal at an output port supplying a high speed input signal from an input means directly to the bufferless input port of the integrated circuit, the input means acting a first transmission line having a characteristic impedance $Z_P$; and broadcasting the signal received at the input port along the conductive trace of the integrated circuit to the plurality of destination cells, the conductive trace being terminated by a far end resistor $R_E$ and acting as a second transmission line having a characteristic impedance $Z_O$, the characteristic impedances $Z_P$ and $Z_O$ of the first and second transmission lines being matched to provide a constant impedance transmission line for distributed broadcasting of the input signal to a selected destination cell to generate an output signal at a selected output port.

The method is termed bufferless distributed broadcasting (BDC), and the BDC broadcast path is characterized by the impedance of the on-chip trace and the input means, i.e. the package trace, are equal $Z_O=Z_P$, so that the incoming signal directly the on-chip trace through a buffereless input port. Advantageously the input signal is supplied with level specifications compatible with the destinations cells, so that signal translation is not needed. For multiport integrated circuits, the elimination of conventional input buffers significantly reduces chip, area and power dissipation, with little or no penalty in broadcast signal quality.

Thus an integrated circuit assembly, integrated circuit, and method for bufferless broadcasting of high speed input signals is provided.

BRIEF DESCRIPTION OF THE DRAWINGS

FIG. 12(a) shows the input eye diagram; FIG. 12(b) shows output eye diagram when BDC broadcasting is used; and, FIG. 12(c) shows the output eye diagram when CDC broadcasting with input buffers is used. In each diagram the horizontal scale is 20 ps/div and the vertical scale is 100 mV/div.

DESCRIPTION OF THE EMBODIMENTS

Figure 1:
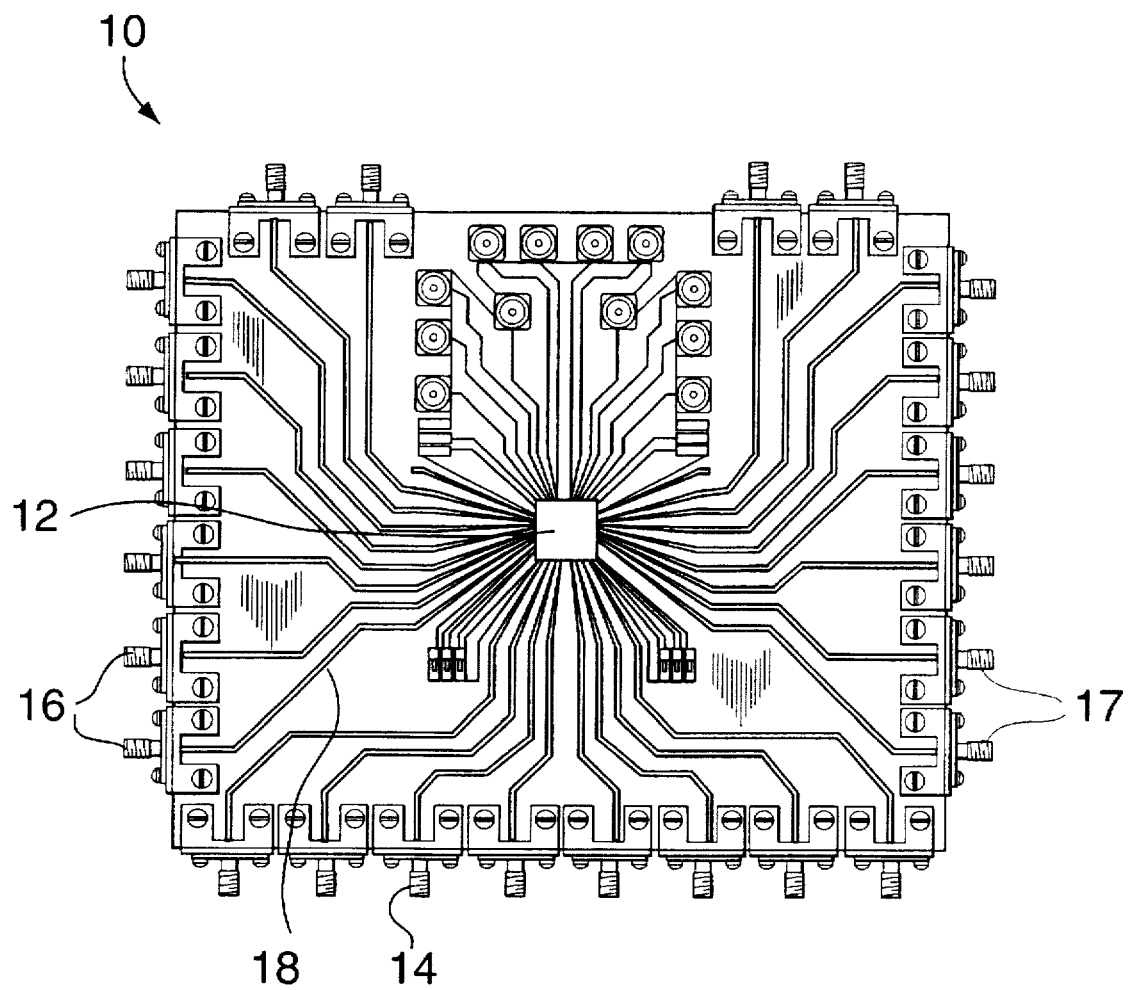
FIG. 1 shows a photomicrograph of an assembly of integrated circuit and package, the integrated circuit comprising an 8×4 crosspoint switch, according to a first embodiment of the present invention.

A photomicrograph of a prototype integrated circuit assembly 10 according to a first embodiment of the present invention is shown in FIG. 1. The assembly comprises an integrated circuit chip 12 and an IC package 14 having conductive interconnections extending from external input/output terminals 16 and 17 of the IC package 14, through conductive traces 18 inside the IC package, which are interconnected to input/output ports of the integrated circuit, e.g. input pads 20 of the IC, via conventional wirebonds 22, i.e. as shown in the enlarged photomicrograph of the integrated circuit 12 in FIG. 2. By way of example, the packaged chip of FIG. 1 measures 152 mm×127 mm and the chip 12 shown enlarged in FIG. 2, measures 3.0 mm×2.5 mm. The integrated circuit 12 comprises a crosspoint switch 24 comprising a plurality of inputs ports 26 and 28 and a plurality of output ports 30. The input ports 26 and 28 may be connected to any one of the outputs 30, through a datapath extending through the crosspoint switch, for broadcasting an input signal from an external source (not shown in FIG. 1) received at an input port 26 or 28 from which signals are broadcast via on-chip conductive traces 42 to one or more of a plurality of destination cells 32 within the integrated circuit 12. In the case of a crosspoint switch the destination cells 32 comprise selector cells, for generating an output signal at a selected one of output ports 30. As is conventional each output port 30 is associated with interface circuitry 34 of the integrated-circuit comprising an output buffer 36. Selected input ports 28 are conventional, comprising interface circuitry 38, and including input buffers 40. Other input ports 26 differ from conventional circuits in that the interface circuitry is bufferless and is designed to provide for bufferless distributed broadcasting (BDC) according to a first embodiment of the invention as will be described in more detail below.

Figure 3:
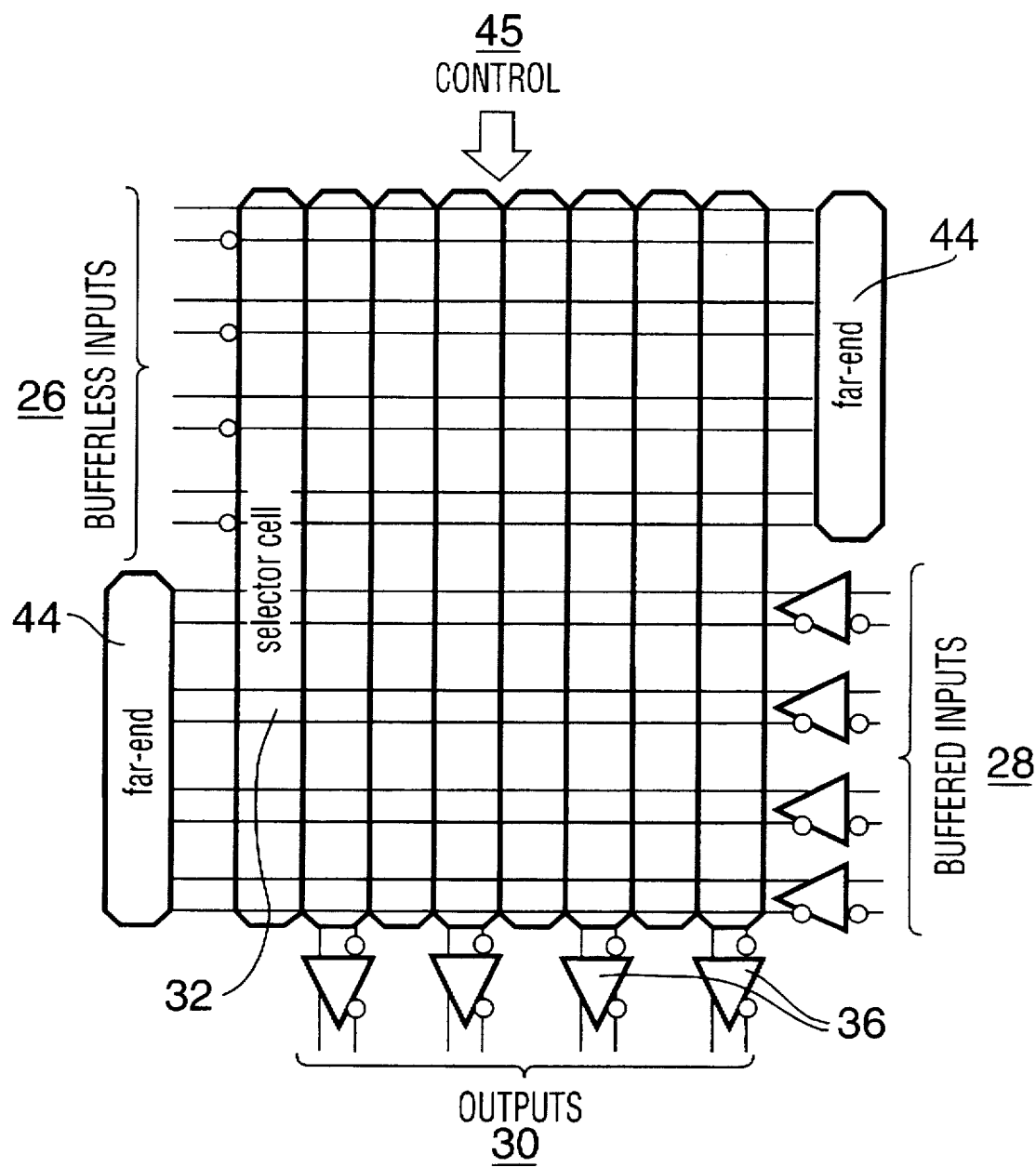
FIG. 3 shows a block diagram of an 8×4 crosspoint witch IC similar to that shown in FIG. 1, which provides for bufferless distributed circuit broadcasting according to the first embodiment of the present invention.

The broadcast and select architecture of the crosspoint switch IC is also shown schematically in FIG. 3. As shown in FIG. 3, each data input signal is broadcast to a series of eight selector cells 32 on the crosspoint IC. The four data inputs 26 shown on the left side are broadcast by a BDC technique. For comparison purposes, the four data inputs 28 shown on the right side are broadcast by the CDC technique.

The technology used to fabricate the crosspoint switch IC is a GaAs HBT process developed at Bell Northern Research Limited and described in more detail in the above-referenced article by Lester et al. which is incorporated herein by reference. The target operating speed is 10 Gb/s per channel and the switch assembly has eight double ended input channels and four double ended output channels.

In the switch assembly, all traces are designed as planar waveguide structures to provide transmission lines with a characteristic impedance of 50 ohms. The on-chip traces 42 are constructed as 50 ohm lumped element coplanar transmission lines on 200 μm thick GaAs Substrate. The section capacitance is $C_O$=80 fF (femtoFarad) and consists of an interconnect capacitance of $C_W$=40 fF plus a selector cell input capacitance of $C_C$=40 fF. The section inductance is $L_O$=0.2 nH and consists entirely of interconnect inductance. In each lumped element section, the conductor width is 3 μm, conductor to ground separation is 12 μm, and conductor length is 250 μm (i.e. the width of a selector cell layout). Conductor sheet resistance is 0.03Ω/square so the series resistance of a section is $R_O$=2.5Ω and the total resistance of an on-chip trace is $r_O$=20Ω. Conversely, the package traces 18 in the switch assembly 10 are constructed as 50Ω tapered coplanar transmission lines on 635 μm thick alumina substrate. At the source end, conductor width is 600 μm and conductor to ground separation is 800 μm. At the package-chip interface end, the conductor width is 100 μm and the conductor-to-ground separation is 56 μm. The maximum package trace length is 10 mm and the maximum package trace resistance is measure to be $r_P \leq 1$ ohm. A typical wirebond length is 0.7 mm so $L_I$=0.7 nH, $C_B$=60 fF and $C_I$=25 fF.

The parameters of the on-chip and off-chip transmission lines of the switch assembly 10 are listed in Table 1. This test assembly was designed with both bufferless and conventional buffered inputs to allow for comparison of the performance characteristics.

Figure 4:
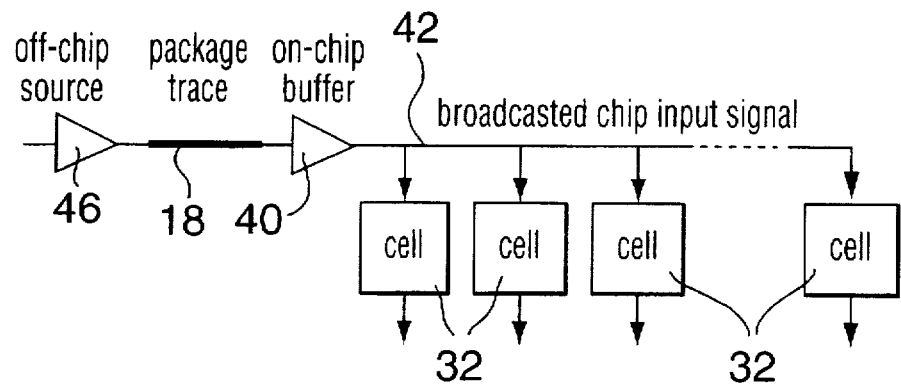
FIG. 4 shows a schematic diagram of a conventional known scheme for distributed broadcasting of high speed input signals from an off-chip source via an input buffer to a series of on-chip destination cells.
Figure 5:
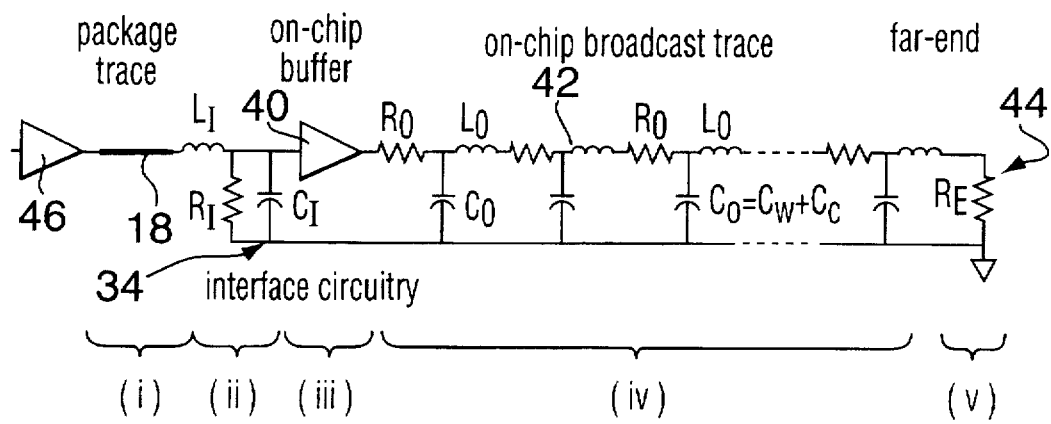
FIG. 5 shows a schematic diagram representing conventional distributed circuit (CDC) broadcasting of high speed input signals from an off-chip source to a series of on-chip destination cells.

Considering first the operation of the conventional buffered input ports 28, input signals from an external source (not shown) are received at input terminals 17 of the package assembly (FIG. 1), and by conventional distributed circuit (CDC) broadcasting, high speed input signals from the off-chip source are broadcast to a series of on-chip destination cells 32. The input signal reaches an input buffer 40 before being distributed to destination cells 32 within the integrated circuit. The latter datapath is represented schematically in a simplified form in FIG. 4, which shows the external source 46, package trace 18, on-chip buffer 40, on-chip broadcast trace 42, and a plurality of selector cells 32. As illustrated schematically in FIG. 5, using a distributed transmission line model, a CDC broadcast datapath having input buffers as described above can be represented schematically in a lumped element approach having five sections. The first section (i) is the package trace 18, which is a transmission line with a constant impedance $Z_P$ across its length, and provides a path for the input signal to travel from its off-chip source to the input port, i.e. input pad at the "edge" of the chip. The second section (ii) of the CDC path is the package chip interface circuitry 34 comprising a wirebond with inductance $L_I$, resistor $R_I$, and pad parasitic capacitance $C_I$. The interface circuitry connects the package trace to the chip and terminates the package trace in its characteristic impedance by having $R_I$=$Z_P$. The third section (iii) is an on-chip input buffer 40 which provides voltage amplitude regeneration and any or all of voltage amplitude translation, voltage offset translation or single ended to double ended translation. Important design parameters of the buffer are: input capacitance, output impedance, and maximum toggle rate. The fourth section (iv) of the CDC datapath is the on-chip broadcast trace 42 which connects the buffer output to the destination cells and is designed to approximate a transmission line that has constant impedance $Z_O$ across its length. This is achieved by modelling the path as a series of lumped element sections where the section capacitance $C_O$ is the sum of wire capacitance $C_W$ and destination cell input capacitance $C_C$ and the section inductance $L_O$ is the sum of wire inductance and any intentionally added discrete element inductances. The section impedance, given by $\sqrt{L_O/C_O}$ is then made equal to $Z_O$ for each section. The fifth section (v) of the CDC datapath is the far-end circuitry comprising of a load resistor $R_E$ 44.

Figure 2:
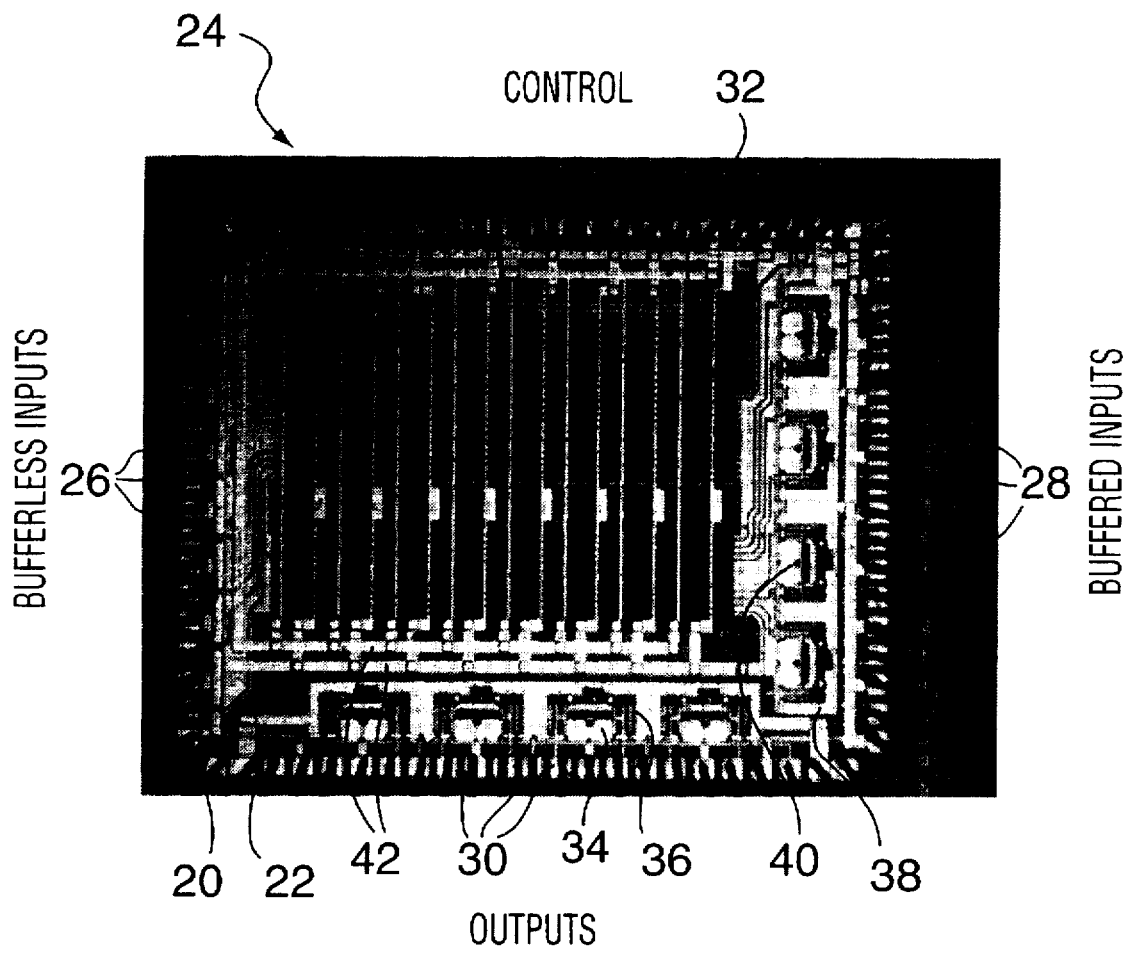
FIG. 2 shows, on an enlarged scale, a photomicrograph of the integrated circuit shown in FIG. 1, comprising the 8×4 crosspoint switch.

As is apparent from FIG. 2, the CDC path incurs overhead because the on-chip input buffers 40 take up a significant area of the chip. The buffers also consume power, and may be a source of jitter. Furthermore, the buffer increases signal propagation delay.

Considering typical values for $L_O$=0.2 nH, $C_O$=80 fF so $f_O$~80 GHz, and $L_I$=0.7 nH, $C_I$=25 fF and $C_B$=60 fF so $f_P$=40 GHz, the design of a crosspoint switch IC for 10 Gb/s data requires a high speed and high dissipation technology such as GaAs HBT. CDC broadcasting may not be feasible when the IC has multiple high speed inputs that would each incur a high power overhead, e.g., in this example 5 ps output jitter, 60 ps propagation delay, 0.15 W power dissipation. Thus conventional buffered inputs have limitations in high speed applications.

Figure 6:
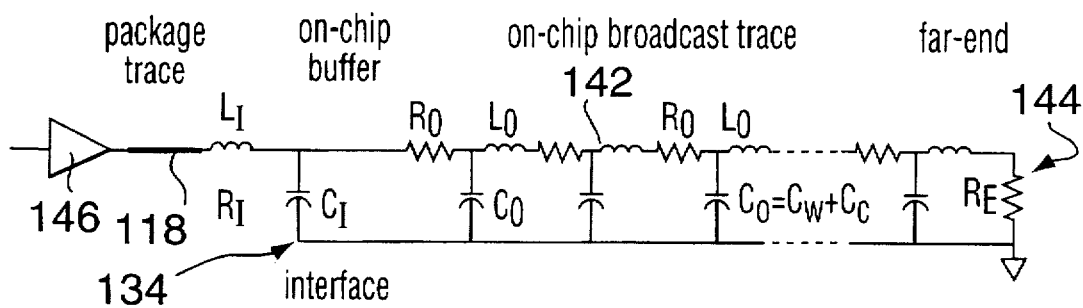
FIG. 6 shows a schematic representing broadcasting of high speed input signals from an off-chip source to a series of on-chip destination cells of an integrated circuit assembly according to a first embodiment of the present invention for bufferless distributed circuit broadcasting.

Considering now the plurality of bufferless input ports 26, the operation of the bufferless input ports of the circuit according to the first embodiment will be described. A transmission line model for the bufferless input ports 26 is shown in FIG. 6. The bufferless data path is represented schematically in FIG. 6 which shows the external source 146, and the data path comprising the package trace 118, simplified interface circuitry 134, on-chip broadcast trace 142, and far end termination, resistor $R_E$ 144. The analysis is simplified by elimination of the input buffer 40 and interface resistor $R_I$ shown in the CDB schematic of FIG. 5. Thus a BDC broadcast path is characterized by an assembly in which the impedances of the on-chip trace and the package trace are matched ($Z_O$=$Z_P$),and the incoming signal directly drives the on-chip trace.

A continuous transmission-line of constant impedance is provided, running from the start of the package trace 118 to the far end of the on-chip trace which is terminated with a load resistor $R_E$ 144. The input of the destination cells and the level specifications of the incoming signal are made compatible so that signal translation is not needed. A conventional on-chip input buffer for each input is eliminated. A package chip interface resistor $R_I$ is not required, and the on-chip transmission lines incorporate the input capacitance of the destination cells.

The input buffer is eliminated with little or no penalty in signal quality. The cut-off frequency of the BDC path $f_{pO}$ is affected by the combined poles of the on-chip and off-chip lines and the attenuation at the far end of the on-chip broadcast path is equal to the combined attenuation of the on-chip and off-chip lines.

The poles of the off-chip line dominate the poles of the on-chip line, and the interconnect resistance of the on-chip line $r_O$, given by summing all the section resistances $R_O$, dominates the interconnect resistance of the off-chip line $r_P$, so corresponding CDC and BCD paths produce similar quality broadcast signals, providing the off-chip signal source is compatible with on-chip signal requirements.

Since there is no on-chip input buffer, the input of the destination cells must be compatible with the chip input signal. Practically, this constraint can be overcome, for example, by using destination cells that have a double ended input and wide common mode input range as described in the above mentioned references to Shin et al. and Savara et al.

Figure 11:
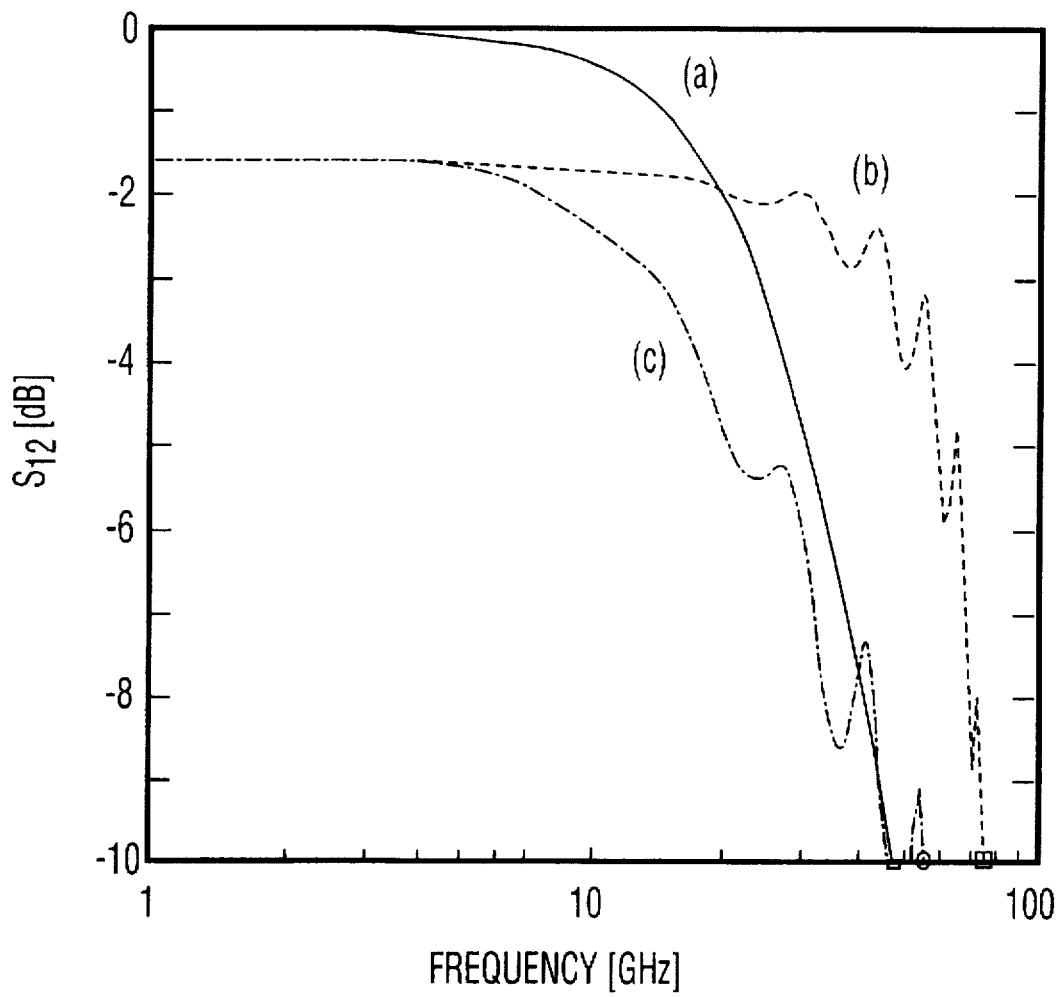
FIG. 11 shows a simulated frequency response for three examples, the off-chip transmission line of the CDC path of FIG. 4 (curve a), the on-chip transmission line of the CDC path of FIG. 4 (curve b), and the combined transmission line of the BCD path (curve c). [Parameters were $Z_P=50\Omega$, $R_P=50\Omega$, $R_I=50\Omega$, $L_1=0.7$ nH, $C_1=25$ fF, $C_B=60$ fF, $R_O=2.5\Omega$, $L_O=0.2$ nH, $C_O=80$ fF, $R_E=50\Omega$ and the number of sections is 8]

The simulated frequency response of the BDC and CDB datapaths are shown in FIG. 11, curves (a) to (c). The frequency response of the BDC broadcast path, curve (c), up to >10 GHz, for $f_O/f_p>2$ and $r_o/r_p>20$, is close to the corresponding CDC broadcast path: i.e. curve (a) shows the on-chip transmission line, and curve (b) shows the off-chip transmission line of the CDC broadcast path respectively.

In testing the switch assembly, the quality of broadcast signal produced by the BDC and CDC paths was measured by inputting a pseudorandom bit stream (PRBS) and examining the resulting output signals.

Figure 12A:
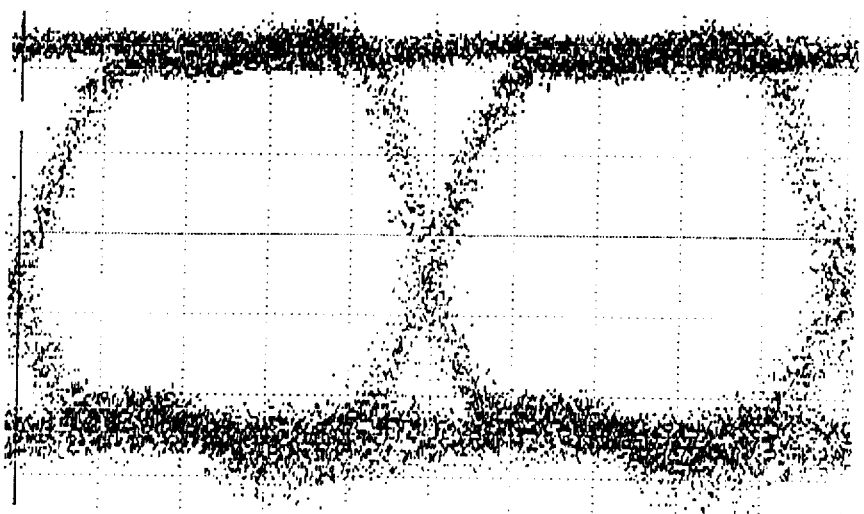
FIGS. 12(a) to 12(c) show measured eye diagrams for the crosspoint switch assembly of FIG. 3.
Figure 12B:
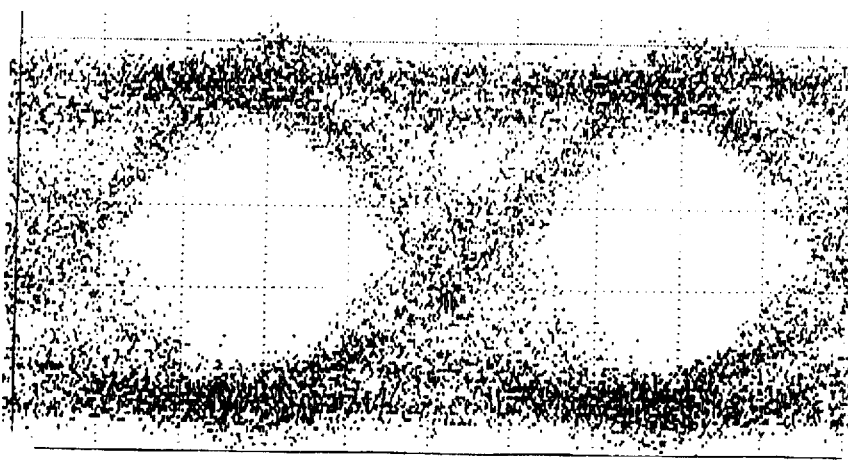
Figure 12C:
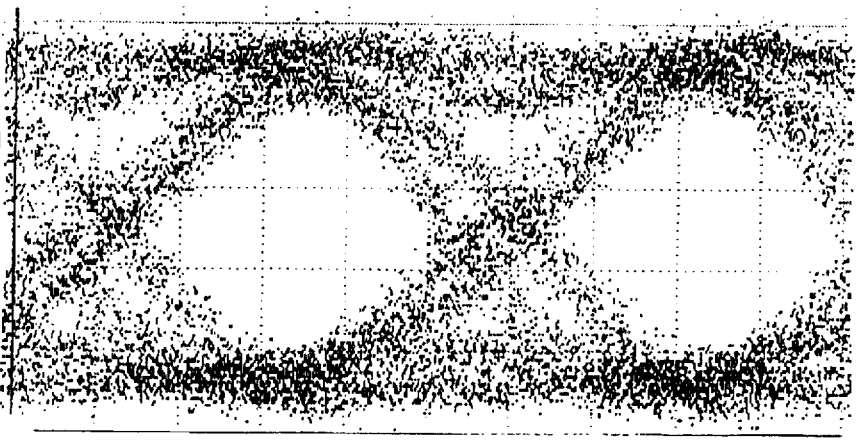

The PRBS input was produced by a pattern generator having a 50Ω output impedance and has an eye pattern as shown in FIG. 12(a). FIG. 12(b) shows the typical output eye pattern resulting from BDC broadcasting, which has about 40 ps peak to peak jitter. As shown in FIG. 12(c), a typical output eye pattern that results from CDC broadcasting also has about 40 ps jitter. Both cases were achieved with a nearest neighbour crosstalk of less than −22 dB and a bit error rate of less than $10^{-12}$. The total power dissipated by the crosspoint switch IC is 2.3 Watts of which 0.6 Watt is due to dissipation of the four input buffers. Implementing the 8×4 switch with BDC broadcasting on all inputs relative to CDC broadcasting on all inputs therefore realises a very significant (~40%) power savings with negligible penalty in jitter or bit error rate.

Bufferless distributed broadcasting offers an effective technique for realising significant power saving in high speed ICs implemented in high dissipation technologies such as GaAs HBT and Si bipolar. BCD broadcasting is applicable to all ICs that do not need an input signal translation and achieves equivalent signal quality to CDC broadcasting up to at least 10 Gb/s data rates. Preferably, destination cells, such as selector cells described for the crosspoint switch, have a double ended input and wide common mode input range to ensure compatibility with the chip input signal.

In summary, a BDC broadcast path is characterized by the impedance of the on-chip trace and the package being equal ($Z_O=Z_P$), the incoming signal directly driving the on-chip trace, and the input of the destination cells and the level specifications of the incoming signal are made compatible so that translation is not needed. A continuous transmission line of constant impedance is provided, running from the start of the package trace to the far end of the on-chip trace. An on-chip input buffer is not used, eliminating the buffer overhead with little or no penalty in signal quality. A package chip interface resistor $R_I$ is not used, and only a far end resistor $R_E$ is needed for signal termination.

As discussed by Sitch et al. in an article entitled "The use of III-V ICs in WDM Optical Network Equipment" GaAs IC Symp. Digest Tech. Papers, pp. 177-180 1995, successful development of WDM equipment requires integration of high speed electronics and electro-optics. III-V ICs including e.g. large scale GaAs HBTs are suited to applications such as crosspoint switches. Nevertheless successful integration requires cost effective devices. Reduction in power dissipation and area requirements by elimination of the input buffers as described above contributes to such cost savings.

Figure 7:
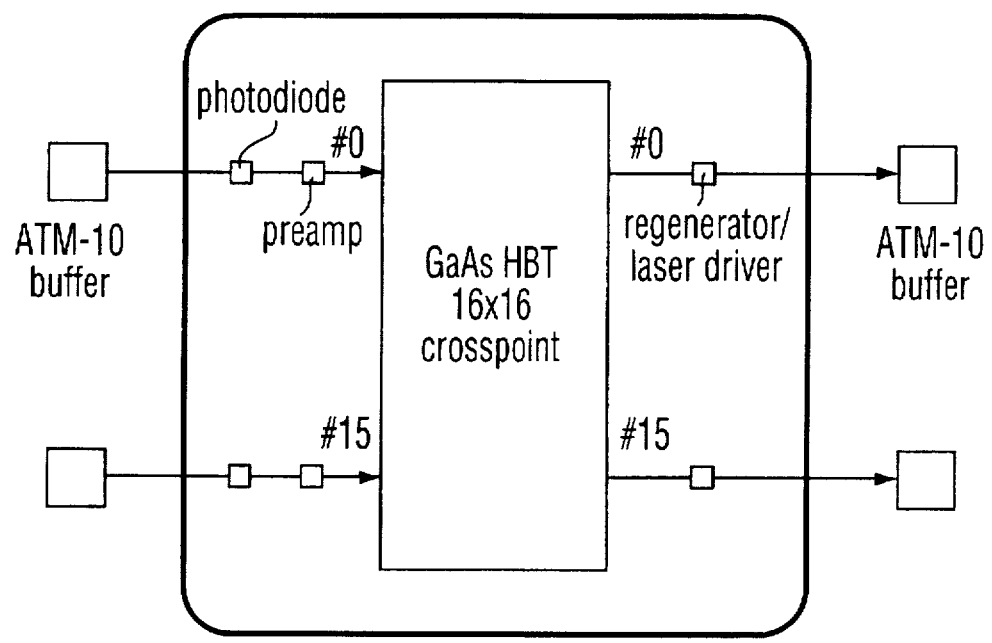
FIG. 7 shows a schematic for a high speed ATM switch core comprising a GaAs HBT 16×16 crosspoint switch according to a second embodiment of the present invention.

Part of an ATM switch core comprising a GaAs HBT 10 Gb/s 16×16 bit crosspoint switch chip according to a second embodiment is shown in FIGS. 7 to 10. This switch is an electronic high speed programmable cross-connect switch with 16 input and 16 output ports. A simplified block diagram is shown in FIG. 7, in which only input and output ports #0 and #15 are shown, for clarity. The crosspoint switch has a broadcast-and-select type architecture, as described above. The chip is designed to establish asynchronous data paths, i.e. no latching of input or output data, and supports a data rate of up to 10 Gb/s per channel, (or 160 Gb/s aggregate). The data inputs and outputs are of a GaAs CML type.

The ATM switch architecture from which this crosspoint switch was derived has been described in more detail in patents to Munter et al., for example: U.S. Pat. No. 5,499,239 "Large capacity modular ATM switch" and U.S. Pat. No. 5,475,679 "Large capacity ATM switch".

The 16×16 crosspoint chip provides a vehicle for development of large scale GaAs HBT circuits integrating 5K or more devices which require improved power dissipation and signal fidelities that are adequate to support multiple 10 Gb/s data channels. Such a technology is the GaAs HBT process developed at Bell Northern Research Limited that allows a minimum emitter dimension of 2 µm×2 µm and described in more detail in the above referenced article by Lester et al.

Figure 8:
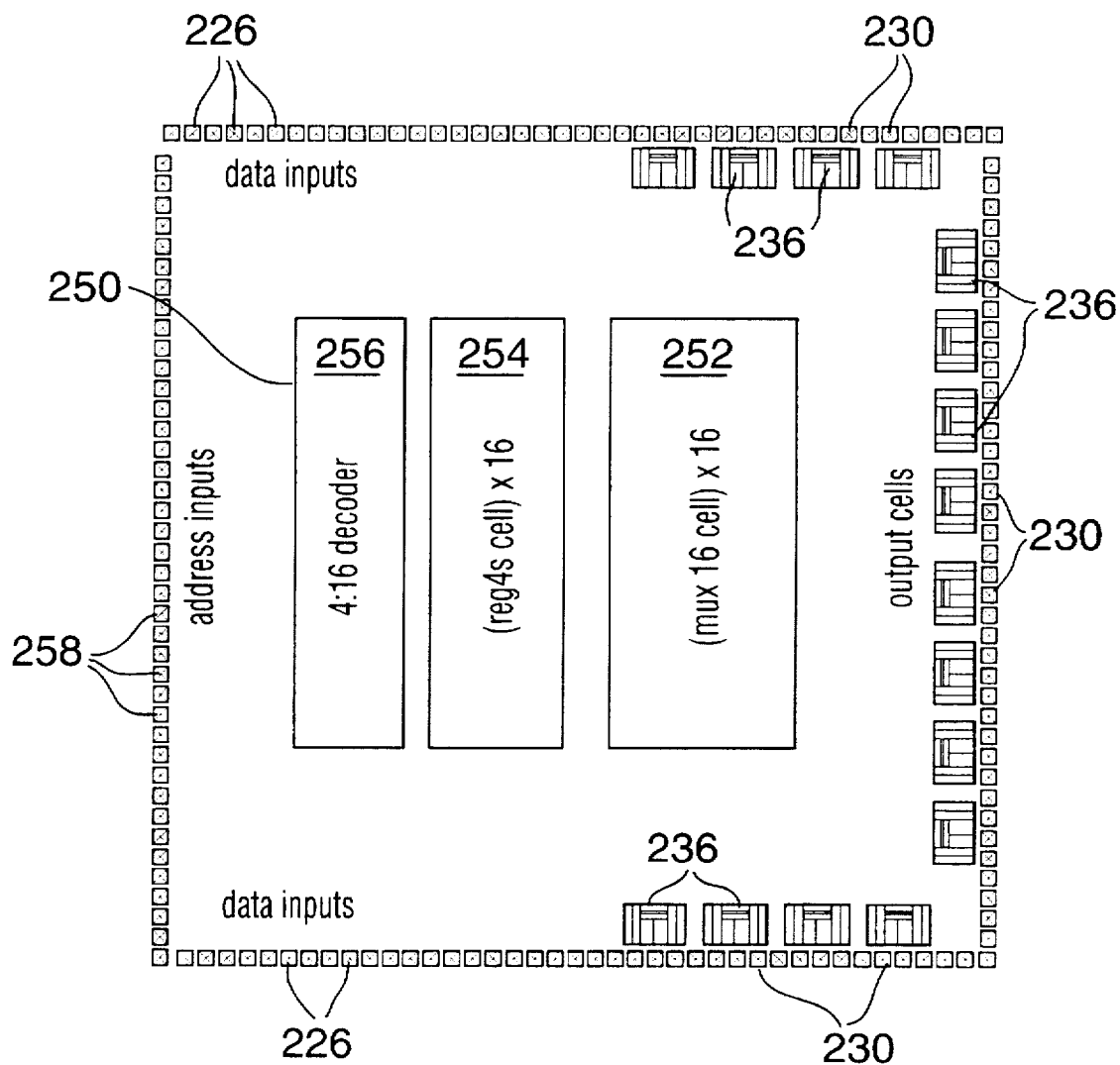
FIG. 8 shows a cell placement sketch for the crosspoint switch of the second embodiment.

A cell placement sketch for the crosspoint switch is shown in FIG. 8, and comprises 16 unbuffered data inputs 226 and 16 buffered data outputs 230, comprising output buffers 236. The crosspoint core 250 comprises 16 independent 16:1 multiplexers 252, 16 sets of 4 bit input address registers (reg4s) 254, a 4:16 bit output address decoder 256. Any output port 230 may be connected to any input port 226. The connections are non-blocking and broadcasting from one input to several or all outputs is possible. The crosspoint switch configuration, which defines an input port address for each output port is stored in 64 on-chip registers 254, controlled by address ports 258. The input port address for an output port is 4 bits and remains valid until an instruction to reprogram the output port is received.

Figure 9:
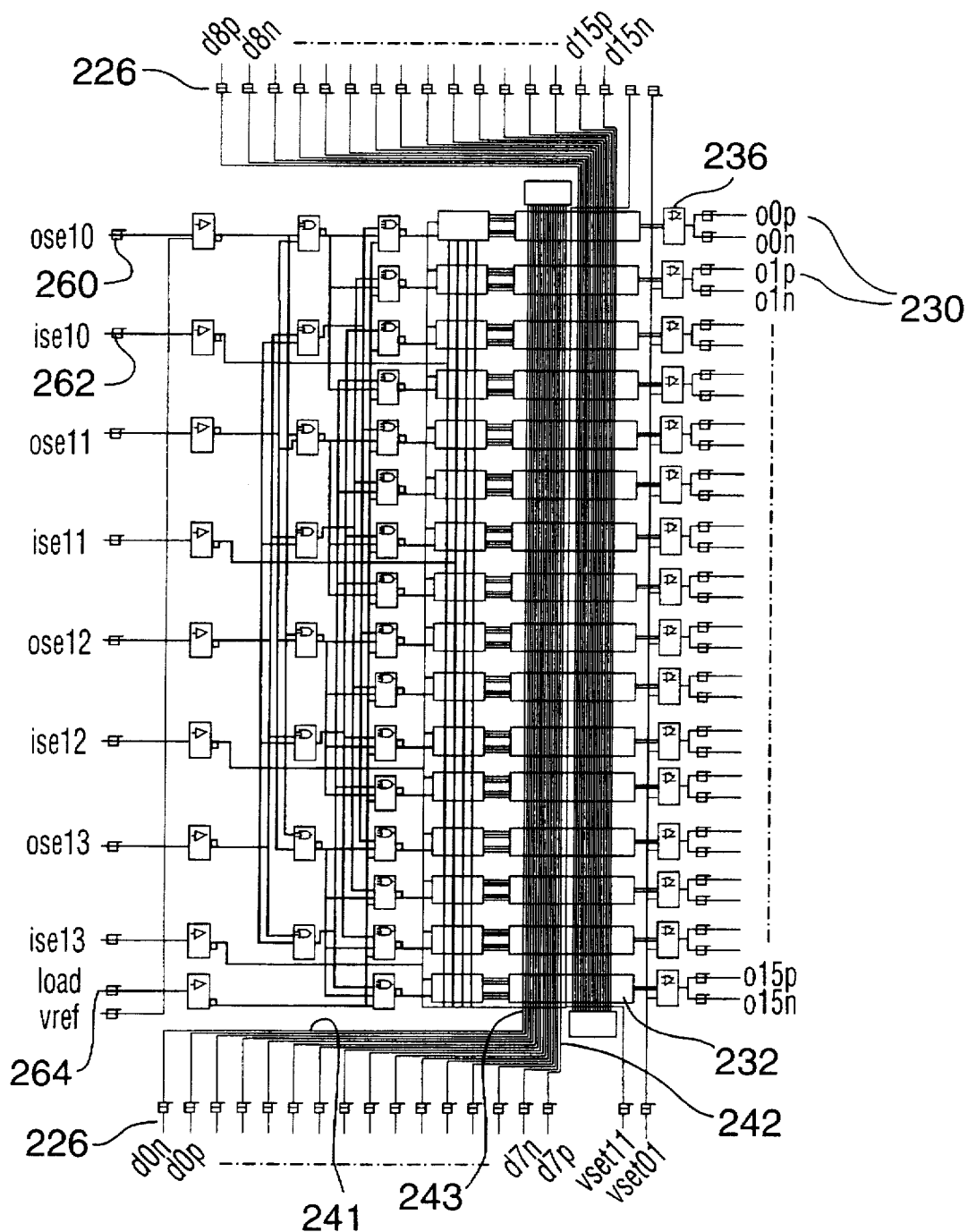
FIG. 9 shows the high level architecture of a GaAs HBT 10 Gb/s 16×16 bit crosspoint switch of the second embodiment.

FIG. 9 shows the top level architecture of the crosspoint switch. The reprogramming is done by inputting the 4 bit output port address on pins 260, ose10:3, and the new 4 bit input port address is input on pins 262, ise10:3, and then inputting a rising edge on the load pin 264. The ose10:3 and ise10:3, and load inputs are all single ended GaAs CML type. The full reprogramming of the crosspoint requires 16 such instructions. The crosspoint configuration on start up is arbitrary.

As shown in the circuit schematic of FIG. 9, each of the data outputs 230 are buffered by an output buffer cell 236. However, unlike a conventional crosspoint switch, to conserve power dissipation, the data inputs 226 are not buffered. Instead each input line is designed as a distributed transmission line having a characteristic impedance of $Z_O$=50Ω. Where an input line passes through the crosspoint core, the characteristic impedance of the line incorporates the input capacitance $C_C$ of the core multiplexer (selector) cells. To limit reflections, the end of the input line is terminated with a load resistance of $R_E$=50Ω. Each data input is assumed to be driven by a 50Ω source. Elimination of conventional input buffers allows for a compact physical layout and efficient routing of on-chip conductive traces. Preferably, as shown, the physical layout of each destination cell 232 is arranged so that its on-chip transmission line sections 242 run across the cell as parallel lines entering on one side of the cell and exiting on the opposite side, to allow destination cells 232 to be placed side by side. A regular array of cells is formed, wherein the set of transmission lines 242 comprise sections 241 and 243, arranged in parallel lines and joined together to form constant impedance transmission lines in the integrated circuit. As shown in FIG. 9, the layout provides for the control (address) ports, and the decoder and registers are arranged conveniently adjacent array of destination cells.

Preliminary simulations suggested that a 50Ω characteristic impedance across the switch core is possible if, for example:

1. the input line is structured as a coplanar waveguide
2. the input linewidth is 3 μm
3. the signal to ground separation is 12 μm
4. the multiplexer input capacitance $C_G$=40 fF and
5. the multiplexers are placed with a pitch of $D_G$=250 μm.

In this chip, other design techniques are used optionally or additionally to reduce power dissipation and device count in the crosspoint switch. These techniques include, for example, 1. selective insertion of emitter-follower output buffering stages;
2. sharing of current mirror circuitry;
3. cell sizing optimization.

For example, an emitter follower is used for the output buffers 236 only where it is justified by fan-out loading conditions and slew rate requirement.

Figures 10, 10A:
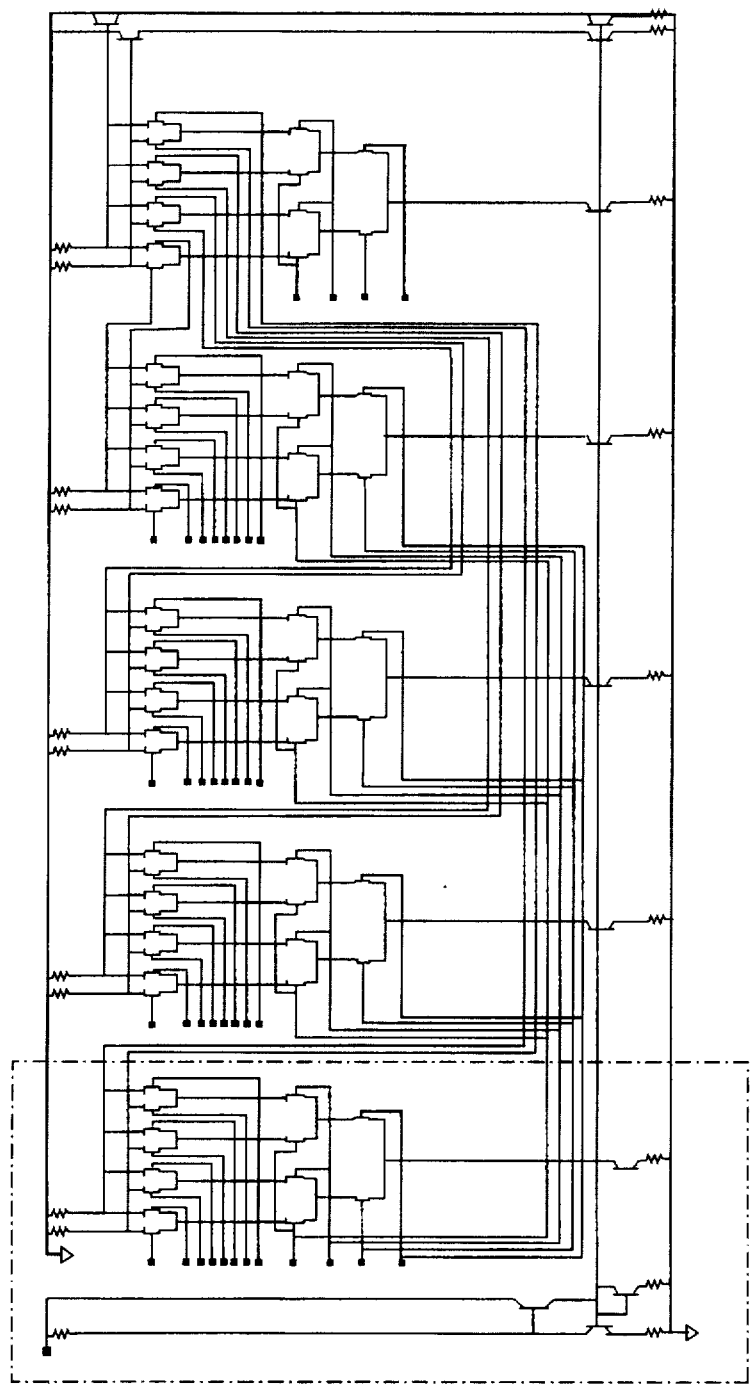
FIG. 10 shows a circuit schematic of an optimised 16:1 multiplexer cell comprising part of the circuit of the second embodiment.
FIG. 10(a) shows on an enlarged scale one of the input connected 4:1 selector cells.
Figure 10A:
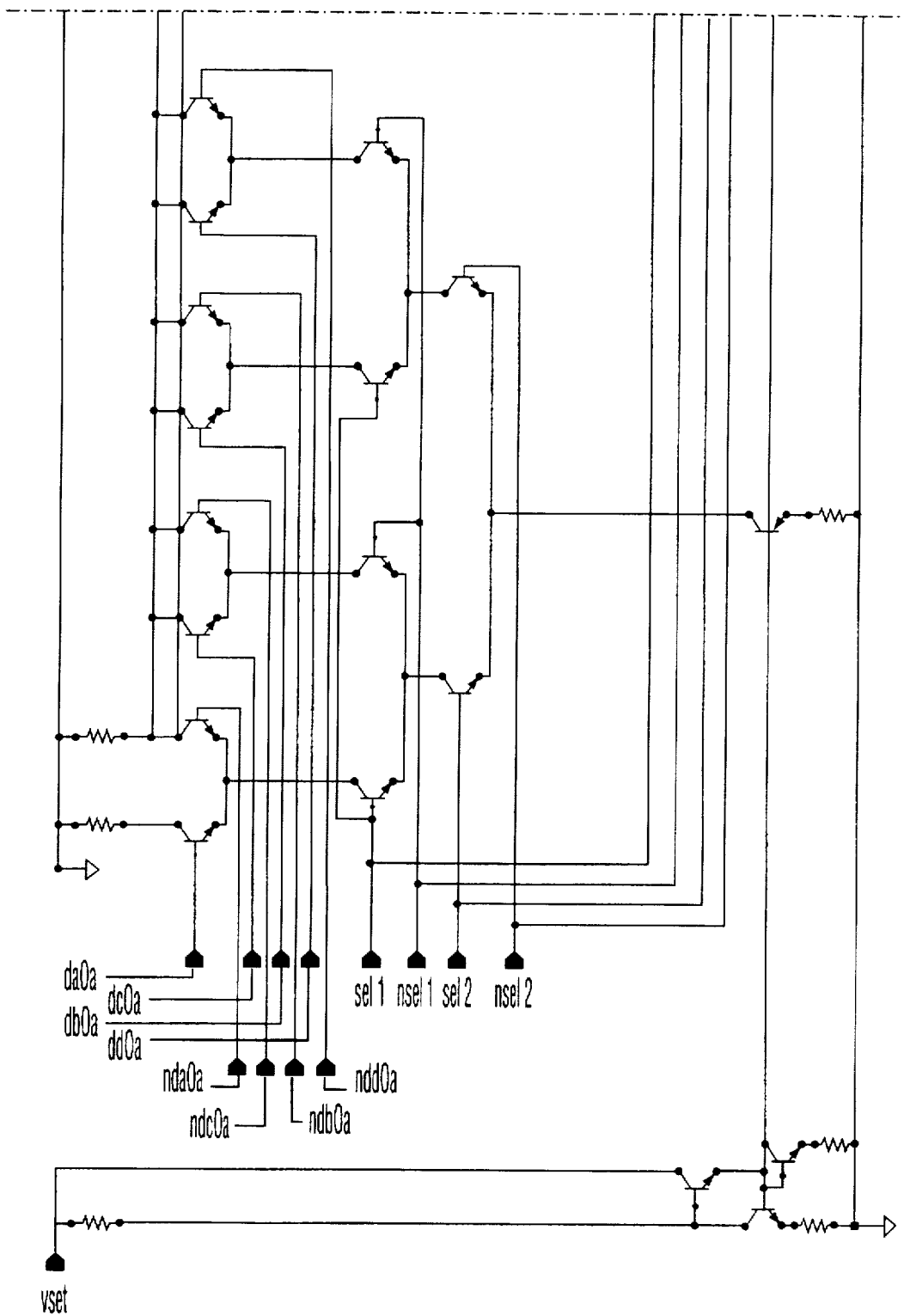

A circuit schematic for the speed/power optimised 16:1 multiplexer is shown in FIG. 10. As an example, FIG. 10(a) shows, on an enlarged scale, one of the input connected 4:1 selector cells (i.e. multiplexer cells identified by the dotted outline shown in FIG. 10. Selector cells have a fully differential CML circuit design. Preferably, cells including the 16:1 multiplexer and 4 bit input address register 254 are designed such that they each use only a single current mirror (appropriately sized).

Advantageously cells that are not speed critical, such as the 4 bit input address registers 254, and those used to implement the 4:16 decoder 256, are down-sized to reduce switching current.

This circuit assembly implementing BDC broadcasting provides improvements over known methods of CDC broadcasting, by enabling significantly lower power dissipation and reduced chip area with negligible penalty in broadcast signal quality.

While an application for a crosspoint switch is described in detail, the BDC approach may be used in other integrated circuits requiring broadcasting of high speed signals to a plurality of destination cells, for example, a parallel multiplier and distributed amplifier, to provide advantages of reduced signal delay and power dissipation.

Other applications for BCD broadcasting include distributed amplifier ICs for external laser modulators, because these ICs require only minor modification to existing layouts, and crosspoint switch ICs for reconfiguration switching, i.e. for restoration switching or wavelength division multiplexing (WDM). These latter ICs have many broadcast paths to exploit.

Thus, while specific embodiments have been described in detail, it will be understood that variations and modifications of the embodiments may be made within the scope of the following claims.

TABLE 1

Parameter Values for First Embodiment Switch Assembly

| Parameter | Symbol | Value | Units |
|---|---|---|---|
| Package trace impedance | $Z_P$ | 50 | Ω |
| Package trace total resistance | $r_P$ | <1 | Ω |
| Package-chip interface resistance | $R_I$ | 50 | Ω |
| Package-chip interface wirebond inductance | $L_I$ | 0.7 | nH |
| Package-chip interface pad capacitance | $C_I$ | 25 | fF |
| On-chip buffer input capacitance | $C_B$ | 60 | fF |
| On-chip trace impedance | $Z_O$ | 50 | Ω |
| On-chip trace number of sections | — | 8 | — |
| On-chip trace section inductance | $L_O$ | 0.2 | nH |
| On-chip trace section capacitance from wire | $C_W$ | 40 | fF |
| On-chip trace section capacitance from cell | $C_C$ | 40 | fF |
| On-chip trace section capacitance (wire + cell) | $C_O$ | 80 | fF |
| On-chip trace section resistance | $R_O$ | 2.5 | Ω |
| On-chip trace total resistance | $r_O$ | 20 | Ω |
| On-chip trace far-end resistance | $R_E$ | 50 | Ω |

I claim:

1. An integrated circuit assembly comprising a distributed broadcast data path from an input port of an integrated circuit to a plurality of destination cells of the integrated circuit for generating an output signal at an output port, comprising:

input means for coupling a high speed input signal to the input port of the integrated circuit, and forming a first transmission line having a characteristic impedance $Z_P$, a conductive trace of the integrated circuit extending from the input port to the plurality of destination cells, the conductive trace being terminated by a load resistor element and forming a second transmission line having a characteristic impedance $Z_O$, the characteristic impedances $Z_P$ and $Z_O$ of the first and second transmission lines being matched to provide for bufferless coupling of the input signal directly to the conductive trace of the integrated circuit.

2. An assembly according to claim 1 comprising a package of the integrated circuit wherein the input means comprises a conductive trace of the package extending from an input terminal of the package to the input port of the integrated circuit.

3. An assembly according to a claim 2 wherein the first transmission line incorporates interface circuitry interconnecting the package and the integrated circuit.

4. An assembly according to claim 3 wherein the interface circuitry comprises a wire bond.

5. An assembly according to claim 1 wherein the second transmission line comprises input capacitances of the destination cells.

6. An assembly according to claim 1 wherein each destination cell has a double ended input and a wide common mode input range compatible with the input signal.

13

7. An assembly according to claim 1 wherein each destination cell has a fully differential CML (current mode logic) circuit design.

8. An assembly according to claim 1 wherein the first transmission line has a coplanar waveguide structure.

9. An assembly according to claim 1 wherein the second transmission line has a coplanar waveguide structure.

10. An assembly according to claim 1 comprising wherein the physical layout of each destination cell provides for an arrangement wherein the second transmission line is constructed as a coplanar waveguide transmission line section that incorporates an input capacitance of the destination cell.

11. An assembly of an integrated circuit and a package, the package having a set of input terminals and a set of output terminals, and the integrated circuit having a corresponding set of input ports and a corresponding set of output ports, the integrated circuit providing a plurality of distributed broadcast datapaths from the input ports to a plurality of selector cells of the integrated circuit for generating output signals at selected output ports of the integrated circuit, a conductive trace of the package extending from each input terminal of the package to the corresponding input port of the integrated circuit, each package trace forming a first transmission line having a characteristic impedance $Z_P$, and a conductive trace of the integrated circuit extending from each input port to each of the plurality of selector cells, each conductive trace being terminated by a load resistor element $R_E$, and forming a second transmission line having a characteristic impedance $Z_O$.

the characteristic impedances $Z_P$ and $Z_O$ of the corresponding first transmission lines and second transmission lines being matched to provide a constant impedance transmission line for bufferless coupling of input signals from input terminals of the package directly to corresponding conductive traces of the integrated circuit.

12. An assembly according to claim 11 wherein each transmission line is provided as a coplanar waveguide structure.

13. An assembly according to claim 11 wherein each of the first transmission lines are provided as coplanar waveguide structures having a tapered width.

14. An assembly according to claim 11 wherein each of the second transmission lines are provided as coplanar waveguide structures of a constant width.

15. An assembly according to claim 11 wherein the plurality of selector cells are arranged in a side-by-side array with sections of the on-chip conductive traces running in parallel lines across each cell, entering one side of each cell and exiting an opposite side of each cell.

16. An assembly according to claim 11 wherein the selector cells comprise multiplexer cells of a crosspoint switch having a fully differential CML (current mode logic) design.

17. An integrated circuit comprising a plurality of input ports and a plurality of output ports, each input port for receiving an input signal for distributed broadcasting to a plurality of destination cells of the integrated circuit for generating an output signal at a selected output port of the integrated circuit, comprising:

a set of conductive traces of the integrated circuit each extending from an input port to the plurality of destination cells, each trace being terminated by a far end load resistor $R_E$, and forming a transmission line having a characteristic impedance $Z_O$.

14 the characteristic impedance $Z_O$ of each transmission line being selected to match a characteristic impedance $Z_P$ of input means coupled to the corresponding input port, thereby providing for bufferless coupling of the input signal from the input means directly to the conductive trace of the integrated circuit.

18. A method of distributed broadcasting of a high speed input signal on an integrated circuit having a distributed broadcast data path comprising a conductive trace extending from a bufferless input port to a plurality of destination cells of the integrated circuit for generating an output signal at an output port, comprising supplying a high speed input signal from an input means directly to the bufferless input port of the integrated circuit, the input means acting as a first transmission line having a characteristic impedance $Z_P$; and broadcasting the signal received at the input port along the conductive trace of the integrated circuit to the plurality of destination cells, the conductive trace being terminated by a far end resistor $R_E$ and acting as a second transmission line having a characteristic impedance $Z_O$.

the characteristic impedances $Z_P$ and $Z_O$ of the first and second transmission lines being matched to provide a constant impedance transmission line for distributed broadcasting of the input signal to a selected destination cell to generate an output signal at a selected output port.

19. A method according to claim 18 comprising supplying an input signal having level specifications compatible with the destinations cells.

20. An integrated circuit assembly comprising a distributed broadcast data path from an input port of an integrated circuit to a plurality of destination cells of the integrated circuit, for generating an output signal at an output port, the destination cells comprising multiplexer cells of a crosspoint switch, and comprising:

input means for coupling a high speed input signal to the input port of the integrated circuit, and forming a first transmission line having a characteristic impedance $Z_P$, a conductive trace of the integrated circuit extending from the input port to the plurality of destination cells, the conductive trace being terminated by a load resistor element, and forming a second transmission line having a characteristic impedance $Z_O$.

the characteristic impedances $Z_P$ and $Z_O$ of the first and second transmission lines being matched to provide for bufferless coupling of the input signal directly to the conductive trace of the integrated circuit.

21. An assembly according to claim 20 wherein the integrated circuit comprises a plurality of input ports and a plurality of output ports, each input port coupled to a distributed broadcast path comprising a conductive trace forming a corresponding transmission line, the physical layout of the destination cells being a side-by-side placement of the destinations cells to form a regular array of cells, wherein the transmission lines extending from each input port run across each destination cell in parallel lines entering on one side of each cell and exiting on an opposite side of the cell.

22. An integrated circuit assembly including an integrated circuit comprising a crosspoint switch that has a broadcast-and-select type architecture comprising a distributed broadcast data path from an input port of the integrated circuit to a plurality of destination cells of the integrated circuit for generating an output signal at an output port, comprising:

input means for coupling a high speed input signal to the input port of the integrated circuit, and forming a first transmission line having a characteristic impedance $Z_P$, a conductive trace of the integrated circuit extending from the input port to the plurality of destination cells, wherein the destination cells comprise multiplexer cells of a crosspoint switch, the conductive trace being terminated by a load resistor element, and forming a second transmission line having a characteristic impedance $Z_O$, the characteristic impedances $Z_P$ and $Z_O$ of the first and second transmission lines being matched to provide for bufferless coupling of the input signal directly to the conductive trace of the integrated circuit.

* * * * *